(12) United States Patent
Enriquez et al.

(10) Patent No.: US 12,557,229 B2
(45) Date of Patent: Feb. 17, 2026

(54) JIG FOR GRAPHICS PROCESSING UNIT SYSTEM

(71) Applicant: AMD Design, LLC, wilmington, DE (US)

(72) Inventors: Kevin Enriquez, Passaic, NJ (US); Jay Pathak, Monroe Township, NJ (US)

(73) Assignee: AMD Design, LLC, Wilmington, DE (US)

( * ) Notice: Subject to any disclaimer, the term of this patent is extended or adjusted under 35 U.S.C. 154(b) by 315 days.

(21) Appl. No.: 18/476,515

(22) Filed: Sep. 28, 2023

(65) Prior Publication Data

US 2025/0113453 A1 Apr. 3, 2025

(51) Int. Cl.
*G06F 1/16* (2006.01)
*H05K 5/00* (2025.01)
*H05K 5/03* (2006.01)
*H05K 7/00* (2006.01)
*H05K 7/14* (2006.01)

(52) U.S. Cl.
CPC ............. *H05K 5/03* (2013.01); *H05K 7/1407* (2013.01)

(58) Field of Classification Search
CPC ...... H05K 5/03; H05K 7/1407; H05K 7/1402; H05K 7/1401; H05K 7/14; H05K 7/1404; H05K 7/1405; H05K 7/1408; H05K 7/1409; H05K 7/1411; H05K 7/1412
See application file for complete search history.

(56) References Cited

U.S. PATENT DOCUMENTS

| | | | |
|---|---|---|---|
| 7,724,537 B1 * | 5/2010 | Grantham | H05K 7/1407 361/801 |
| 10,420,234 B1 * | 9/2019 | Mao | G06F 1/186 |
| 11,538,132 B2 * | 12/2022 | Ni | G06F 15/78 |
| 2017/0157767 A1 * | 6/2017 | Takamizawa | B25J 9/1697 |
| 2019/0329367 A1 * | 10/2019 | Tsai | F28F 3/02 |
| 2021/0201435 A1 * | 7/2021 | Ni | H05K 7/1485 |
| 2023/0282997 A1 * | 9/2023 | Kuo | H01R 12/7058 361/679.32 |
| 2024/0389247 A1 * | 11/2024 | Chintapatla | H05K 7/14 |

* cited by examiner

*Primary Examiner* — Anthony M Haughton
(74) *Attorney, Agent, or Firm* — SCULLY, SCOTT, MURPHY & PRESSER, P.C.

(57) ABSTRACT

A jig is provided for a graphics processing unit (GPU) system. The jig includes a front component operable to couple with the GPU system. The front component including a top panel operable to enclose a GPU board of the GPU system, and a plurality of guide tubes extending from the top panel. The guide tubes are operable to be aligned with a plurality of screws to couple the GPU board with a GPU tray. The guide tubes are operable to receive and guide a tool to gain access to the plurality of screws.

20 Claims, 10 Drawing Sheets

JIG FOR GRAPHICS PROCESSING UNIT SYSTEM

FIELD

The present disclosure relates generally to a jig operable to assist with coupling a graphics processing unit (GPU) board to a GPU tray.

BACKGROUND

A conventional graphics processing unit (GPU) board includes eight GPU modules and other functional hardware. There are 17 captive screws used to fasten the GPU board to a chassis or a sub-system enclosure, such as a GPU tray.

BRIEF DESCRIPTION OF THE DRAWINGS

Implementations of the present technology will now be described, by way of example only, with reference to the attached figures, wherein.

DETAILED DESCRIPTION

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein can be practiced without these specific details. In other instances, methods, procedures and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

Several definitions that apply throughout this disclosure will now be presented. The term "coupled" is defined as connected, whether directly or indirectly through intervening components, and is not necessarily limited to physical connections. The term "substantially" is defined to be essentially conforming to the particular dimension, shape or other word that substantially modifies, such that the component need not be exact. For example, substantially cylindrical means that the object resembles a cylinder, but can have one or more deviations from a true cylinder. The term "about" means reasonably close to the particular value. For example, about does not require the exact measurement specified and can be reasonably close. As used herein, the word "about" can include the exact number. The term "near" as used herein is within a short distance from the particular mentioned object. The term "near" can include abutting as well as relatively small distance beyond abutting. The terms "comprising," "including" and "having" are used interchangeably in this disclosure. The terms "comprising," "including" and "having" mean to include, but not necessarily be limited to the things so described.

The present disclosure provides a jig that is operable to facilitate assembly and service of a GPU board. The jig is operable to enclose the entire GPU board while only allowing access to screws received by screw holes that are operable to couple the GPU board to a GPU tray. GPU boards can have tall heatsinks, and the screws can be located in-between the heatsinks. For example, the distance from the top of the GPU board to the screws can be at least 130 millimeters. In some examples, the distance can be about 180 millimeters. This can make it difficult for operators to locate and fasten 17 screws (e.g., captive screws) without any extension adapter or a long screw bit for a tool to fasten the screws (e.g., a screwdriver). These difficulties can lead to damaged components around the captive screws.

In some examples, for improved visibility, the jig can be at least partially transparent, for example being made of clear acrylic material. The only access to the GPU board (for example the screws or screw holes) is provided through guide tubes and/or guide blocks. In some examples, the guide tubes and/or guide blocks can be made from acrylic for visibility. The guide blocks and/or guide tubes can be replaceable as they have a high chance of being worn.

Having fixed constrained features on the GPU board and the GPU tray, the jig includes two components to avoid interferences. A front component is positioned above the GPU board, and a rear component is positioned adjacent a rear end of the GPU board and GPU tray. In at least one example, the rear component can be made of sheet metal and/or tooled plastic due to limitations of bending acrylic while also protecting exposed heatsinks. The jig can also include one or more handles on the front component and/or the rear component for easy accessibility. The jig can result in less damages and improved turnover for processes such as installation, service, and/or repair of the GPU board and/or GPU tray.

Figure 1A:
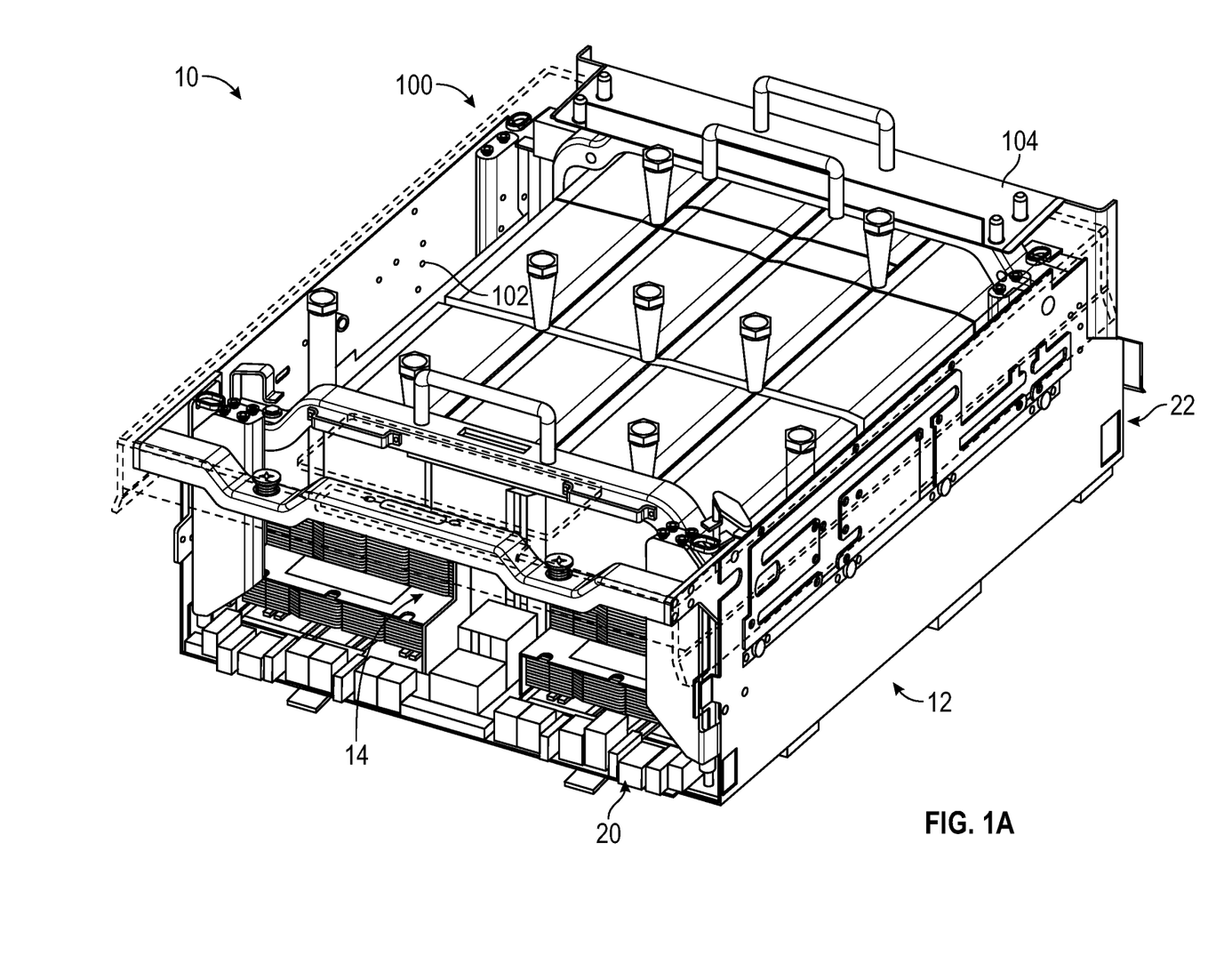
FIG. 1A illustrates a computing system with a jig.
Figure 1B:
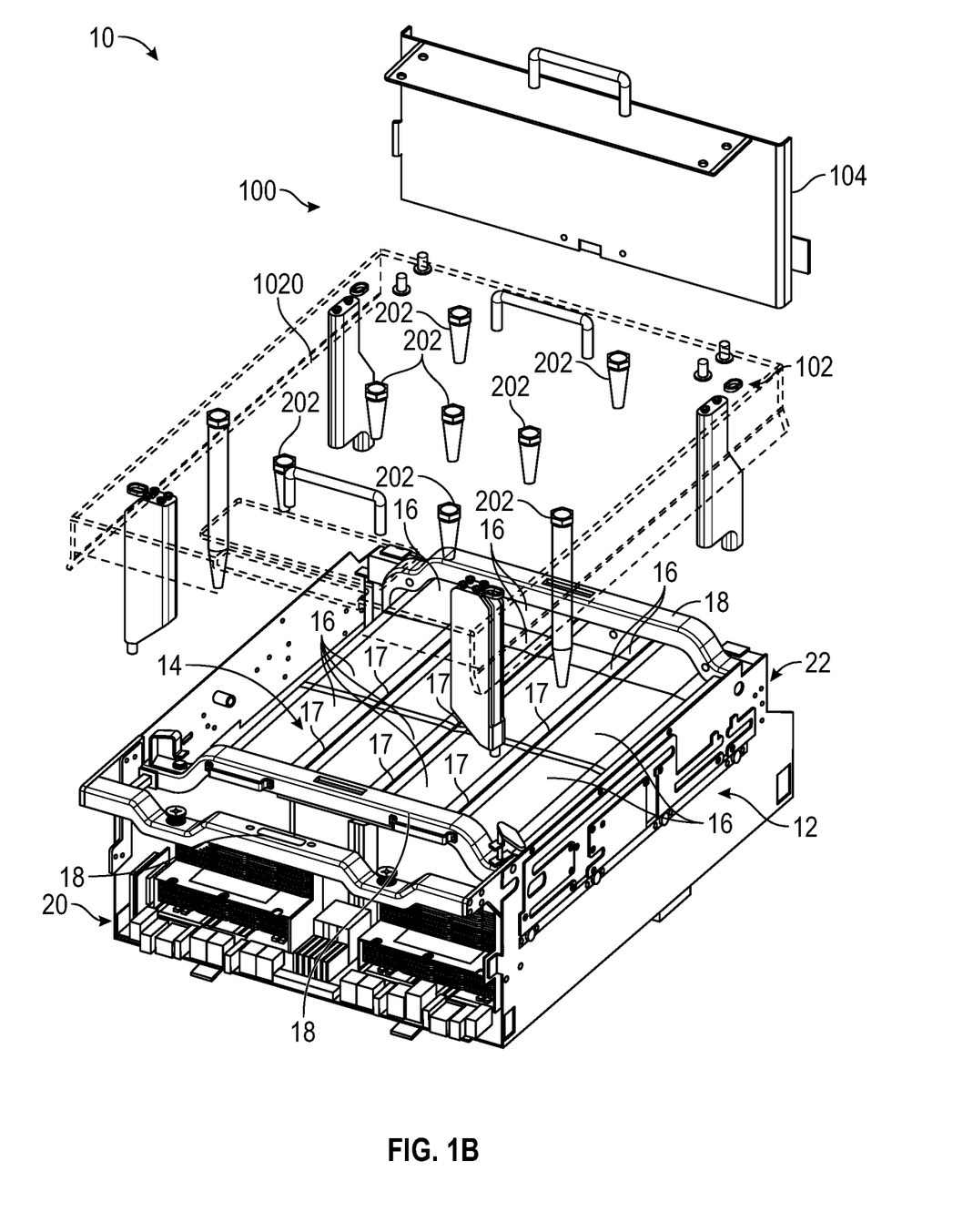
FIG. 1B illustrates an exploded view of the computing system of FIG. 1A.
Figure 1C:
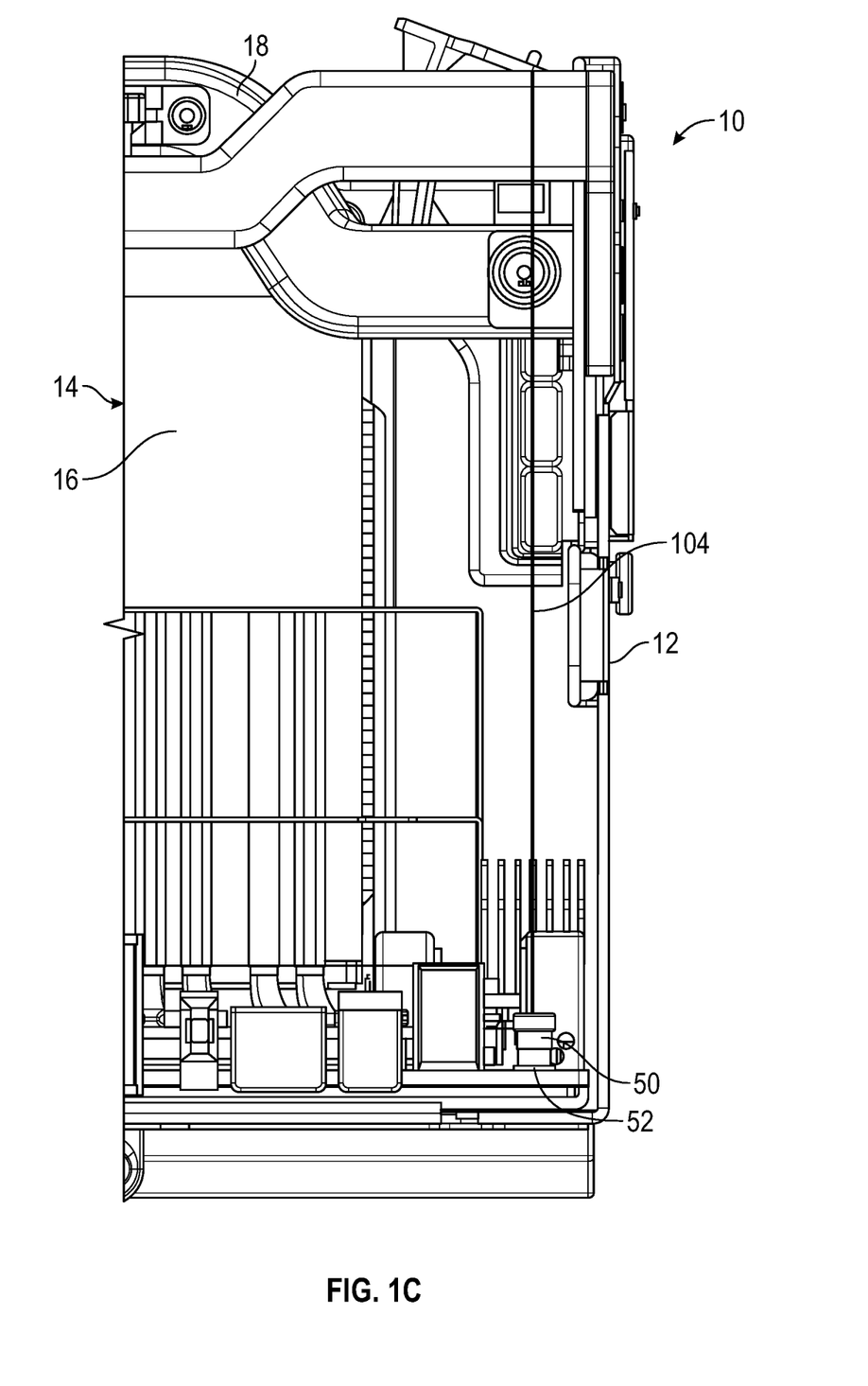
FIG. 1C illustrates a partial view of the computing system of 1A.

FIGS. 1A, 1B, and 1C illustrate a GPU system 10 that includes a GPU board 14 and a GPU tray 12. The GPU tray 12 can be operable to receive the GPU board 14. The GPU system 10 can have a front end 20 and a rear end 22 opposite the front side 20. The GPU board 14 can include a plurality of GPU components 16, such as heatsinks, capacitors, transistors, etc. The GPU tray 12 can include one or more handles 18 which a user can utilize to lift and/or move the GPU board 14 within the GPU tray 12, the GPU tray 12, and/or the entire GPU system 10.

The GPU board 14 can be coupled with the GPU tray 12 via a plurality of screws 50. The screws 50 can include captive screws. In some examples, the screws 50 can be received by threaded stand offs that are press fit into the GPU tray 12. In some examples, the screws 50 can be received within corresponding screw holes 52 formed in the GPU board 14. The screws 50 can be received in and pass through the screw holes 52 in the GPU board 14 and reach the GPU tray 12. The screws 50 can then be fastened to the GPU tray 12 through the screw holes 52 in the GPU board 14 to couple the GPU board 14 with the GPU tray 12.

However, as shown in FIG. 1C, the GPU components 16 can extend from the bottom of the GPU board 14 a distance 104 that can cause issue with reaching the screws 50 in the screw holes 52. In at least one example, the distance 104 can be between up to about 220 millimeters. In some examples, the distance 104 can be between about 133 millimeters and about 180 millimeters. In at least one example, the screws 50 and the screw holes 52 can be accessed in-between the GPU components 16 as the GPU components 16 can form gaps 17 therebetween. Given the distance 104, reaching in the gaps 17 between the GPU components 16 to access the screws 50 can be difficult. Additionally, in some examples, the GPU system 10 can include 17 screws 50 that need to be fastened to couple the GPU board 14 with the GPU tray 12. Conventionally, without a jig 100 as disclosed herein, the tool (e.g., screwdriver) can then damage the GPU components 16 around the screws 50 as the user tries to semi-blindly or blindly access the screws 50 between the GPU components 16.

To facilitate assembly and service of the GPU system 10, the jig 100 can be included to guide the tool to access the screws 50 to fasten, or in the case of service unfasten, the GPU board 14 with the GPU tray 12. The jig 100 can be removably coupled with the GPU system 10. For example, when the screws 50 need to be fastened or unfastened, the jig 100 can be coupled with the GPU system 10. Once the activity (fasten or unfasten) is completed, the jig 100 can be removed from the GPU system 10.

The jig 100 as shown in FIGS. 1A and 1B include a front component 102 operable to couple with the GPU system 10. For example, the front component 102 can be coupled with the GPU tray 12. In some examples, the front component 102 can be coupled with the GPU board 14. In some examples, the front component 102 can be coupled with both the GPU tray 12 and the GPU board 14 to ensure that the front component 102 is securely fastened to the GPU system 10.

In at least one example, as illustrated in FIGS. 1A and 1B, the jig 100 can also include a rear component 104. The rear component 104 can be operable to be coupled with the front component 102. In some examples, the rear component 104 can be integral with the front component 102. The rear component 104 can be operable to be positioned adjacent the rear end 22 of the GPU board 14 and the GPU tray 12.

With the front component 102 and the rear component 104, the jig 100 is operable to be positioned on the GPU system 10 such that the jig 100 covers and protects the GPU tray 12 and the GPU components 16 of the GPU board 14. Accordingly, the only access to the GPU system 10 is via the jig 100 which only permits access to the screws 50.

Figure 2:
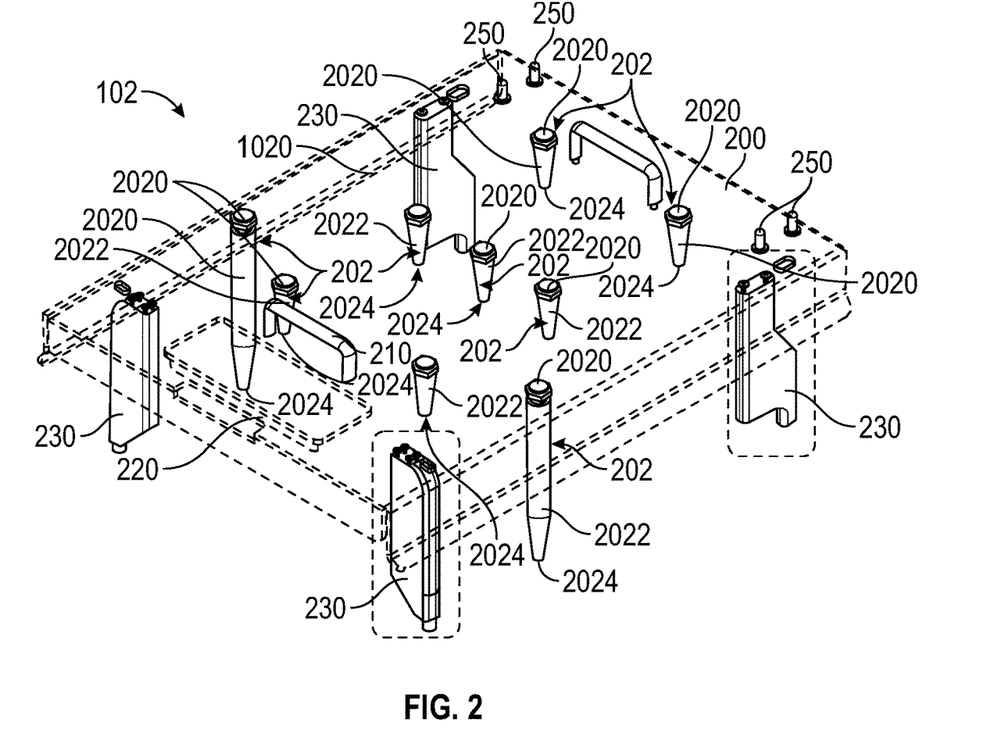
FIG. 2 illustrates a front component of the jig.

FIG. 2 illustrates the front component 102 of the jig 100. The front component 102, as illustrated in FIG. 2, can include a top panel 1020 which is operable to enclose the GPU board 14 when the front component 102 is coupled with the GPU system 10. A plurality of guide tubes 202 can extend from the top panel 1020. The guide tubes 202 can be operable to be aligned with the screws 50 to couple the GPU board 14 with the GPU tray 12. For example, as illustrated in FIG. 2, the top panel 1020 can include 9 guide tubes 202 that correspond with and are aligned with 9 screws 50 for coupling the GPU board 14 with the GPU tray 12. The guide tubes 202 can be coupled with the top panel 1020 such that the tool (e.g., screwdriver; not shown) can be inserted into the guide tubes 202 through the top panel 1020 and gain access to the screws 50 to fasten the screws 50 within the screw holes 52. Accordingly, the guide tubes 202 can be operable to receive and guide the tool to gain access to the plurality of screws 50. As the tool can only be inserted into the GPU system 10 via the guide tubes 202, the tool does not damage the GPU system 10 and is directed directly to the screws 50 for easy assembly/disassembly by the user.

As illustrated in FIG. 2, the guide tubes 202 can each include top openings 2020 operable to receive the tool. The top openings 2020 can form an entry point for the tool to pass through the top panel 1020. The guide tubes 202 can each include a tubular body 2022 operable to extend from the top openings 2020 at the top panel 1020 towards the screws 50 via the bottom top openings 2024. The tool can then enter the tubular body 2022 via the top opening 2020 and exit the tubular body 2022 via the bottom opening 2024 to interact with the screw 50. In some examples, the tubular bodies 2022 of the guide tubes 202 can be operable to extend to the screws 50 such that bottom openings 2024 of the tubular bodies 2022 abut against the screws 50. In some examples, the tubular bodies 2022 of the guide tubes 202 can be operable to extend to the screws 50 such that the bottom openings 2024 of the tubular bodies 2022 are a short distance (e.g., less than about 5 millimeters, in some examples less than about 2.5 millimeters) above the screws 50 so that the tool is easily guided to the screws 50. In at least one example, the guide tubes 202 are operable to extend between the GPU components 16 of the GPU board 14. For example, the guide tubes 202 are positioned such that when the top panel 1020 is coupled with the GPU system 10, the guide tubes 202 extend into the gaps 17 between the GPU components 16. In some examples, at least one of the guide tubes 202 can be operable to abut to the GPU components 16. In at least one example, the guide tubes 202 can be operable to extend from the top panel 1020 and have a length of between about 50 millimeters and about 145 millimeters. The guide tubes 202 can have customizable heights so that the guide tubes 202 correspond with the GPU system 10 and the placement of the screws 50.

In at least one example, the guide tubes 202 can be detachably coupled with the top panel 1020 such that the guide tubes 202 can each be replaceable. Accordingly, as the guide tubes 202 wear down due to use, the guide tubes 202 can be easily replaceable without needing to replace the entire jig 100 or top panel 1020.

Figure 3A:
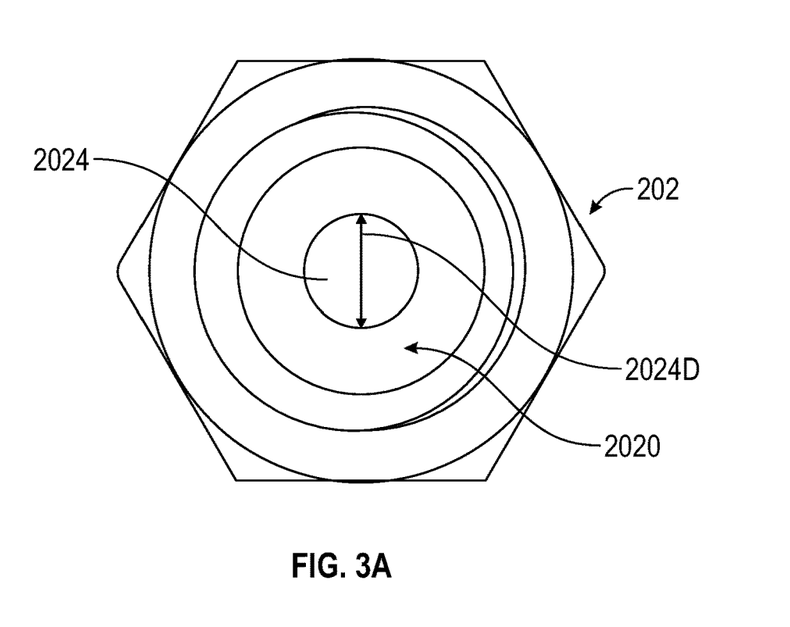
FIG. 3A illustrates a top view of a guide tube.
Figure 3B:
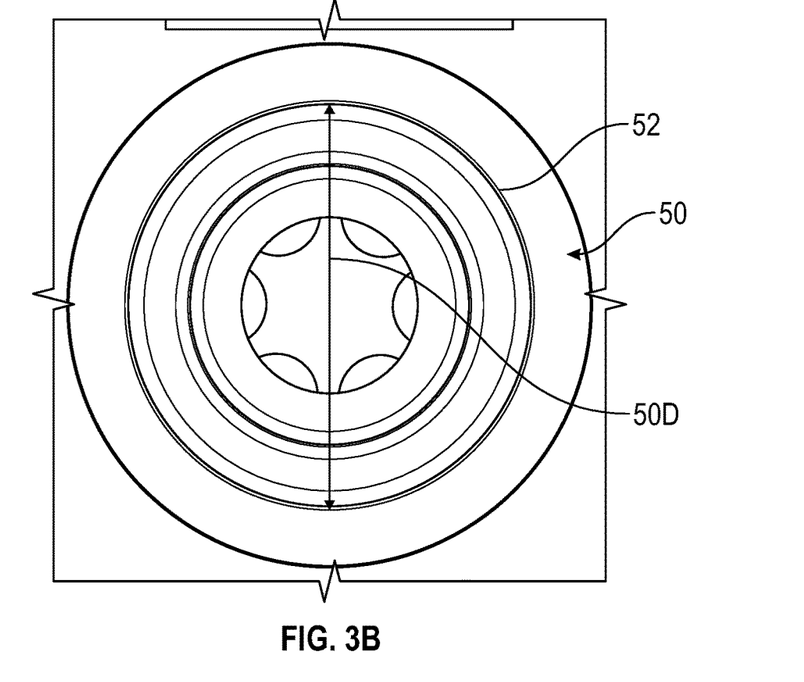
FIG. 3B illustrates a top view of a screw.
Figure 3C:
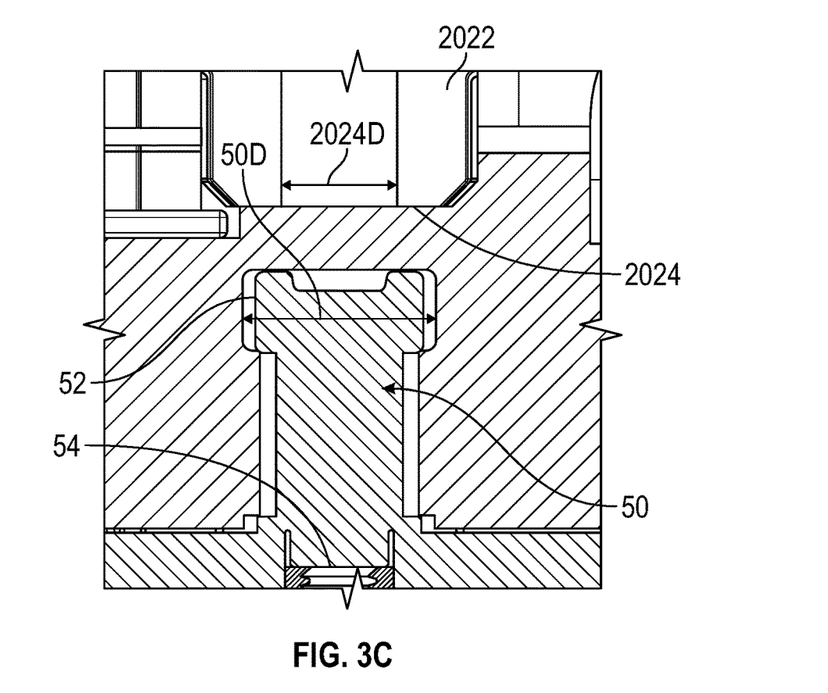
FIG. 3C illustrates a cross-sectional view of the guide tube and the screw in the computing system.

Referring to FIGS. 3A, 3B, and 3C, the guide tubes 202 can have a specific configuration to correspond with the screws 50 of the GPU system 10. FIG. 3A illustrates a top view of a guide tube 202. In some examples, as illustrated in FIG. 3A, the top opening 2020 can be larger than the bottom opening 2024. Accordingly, the top opening 2020 allows for easier entry for the tool, while the bottom opening 2024 restricts the movement of the tool for guidance into the GPU system 10 towards the screws 50 to avoid collision and damage to the GPU system 10. The bottom opening 2024 can have a diameter 2024D between about 4 millimeters and about 7 millimeters. In some examples, the diameter 2024D can be between about 4.5 millimeters and about 6 millimeters. Meanwhile, referring to FIG. 3B, the screw 50 has a head 52 that has a screw diameter 50D that is about 7.7 millimeters. As shown in FIG. 3C, the bottom opening 2024 of the guide tubes 202 can have a smaller diameter 2024D than the screw diameter 50D of the head 52. Accordingly, the tool does not travel anywhere but to the head 52 of the screw 50 when the guide tube 202 is properly aligned.

In at least one example, as illustrated in FIGS. 1A, 1B, and 2, the top panel 1020 can be at least partially transparent. Accordingly, the front component 102 provides visibility so the user can still visibly see how the jig 100 is aligned and whether the guide tubes 202 are in the desired positions. In some examples, the top panel 1020 can include an acrylic material.

Figure 4:
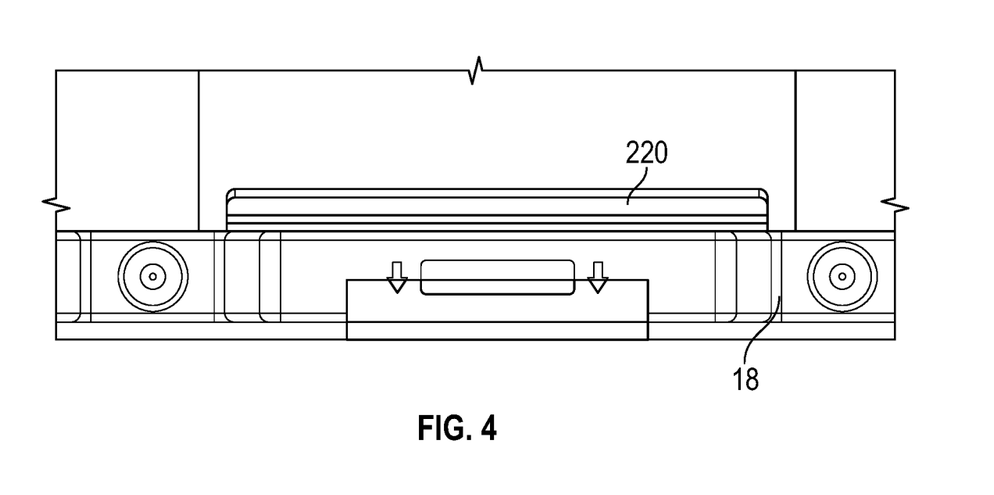
FIG. 4 illustrates a partial top view of a handle of the computing system coupled with the jig.

In at least one example, referring to FIGS. 2 and 4, the front component 102 can include a flange 220 that is operable to receive the handle 18 of the GPU system 10 to couple the front component 102 with the GPU system 10. The flange 220 can wrap around the handle 18 to eliminate undesired movement of the front component 102. Accordingly, the front component 102 can easily couple with the GPU system 10 utilizing the features of the GPU system 10 without needing additional modification. The front component 102 can be operable to be retrofit to the GPU system 10.

Figure 5:
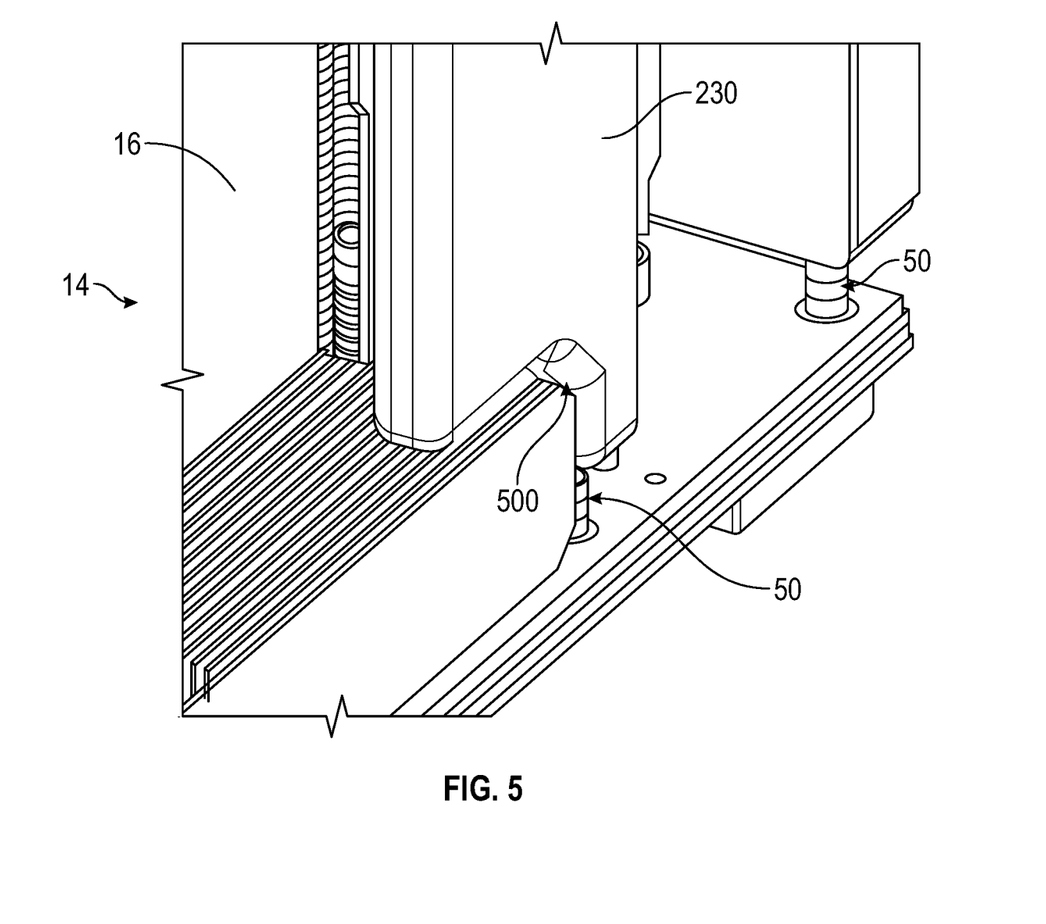
FIG. 5 illustrates a partial view of the computing system aligning with a guide block of the jig.

Referring to FIGS. 2 and 5, the front component 102 can include one or more guide blocks 230 operable to align the front component 102 with the GPU system 10. In some examples, the guide blocks 230 can include guide tubes 202 so that access to screws 50 can be made via the guide blocks 230. The guide blocks 230, as shown in FIG. 5, can have a block surface 500 that is configured to correspond with conventional features of the GPU system 10. For example, as shown in FIG. 5, the GPU system 10 can have a heatsink, and the block surface 500 can be angled such that the heatsink receives the block surface 500 of the guide block 230. The guide blocks 230 can also provide a custom path to avoid interferences with features of the GPU system 10 (e.g., the GPU board 14 and/or the GPU tray 12). Accordingly, when the front component 102 is properly aligned, the guide blocks 230 are received by the conventional features of the GPU system 10, and no additional modifications of the GPU system 10 are needed for the GPU system 10 to work with the jig 100.

Figure 6A:
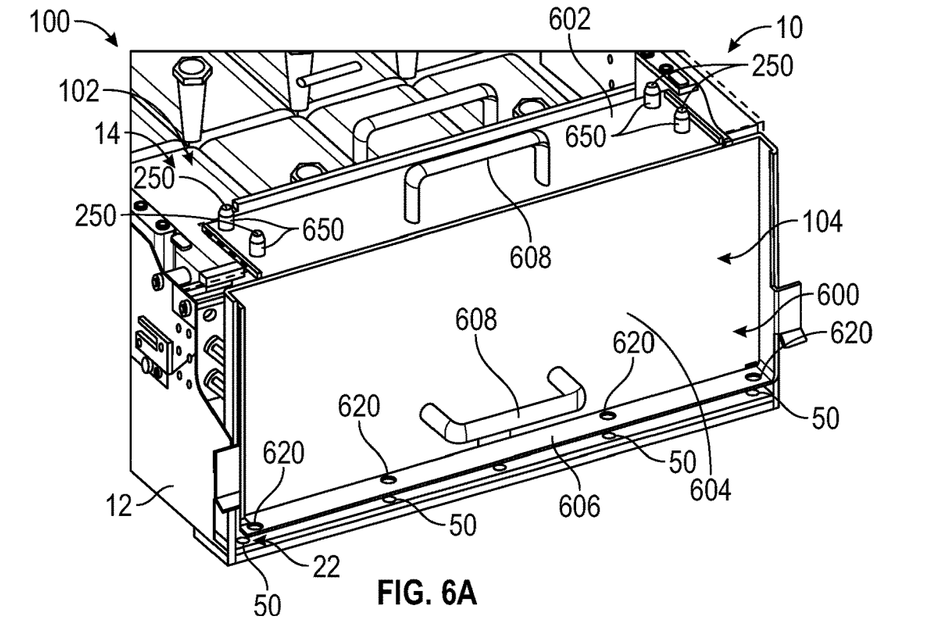
FIG. 6A illustrates a partial rear view of the computing system with the jig.
Figure 6B:
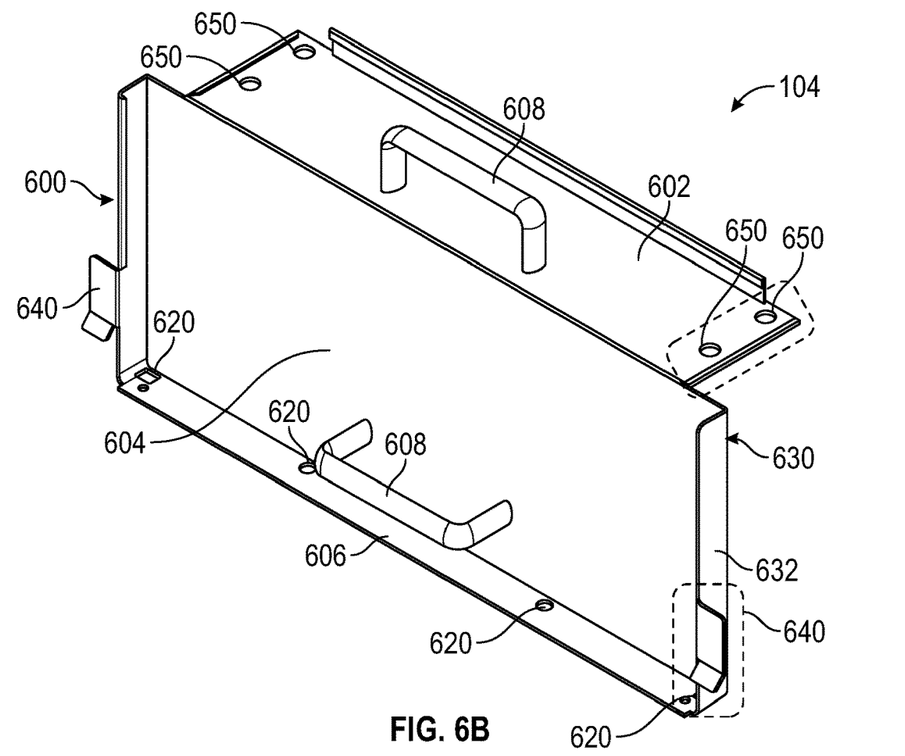
FIG. 6B illustrates a rear component of the jig.
Figure 6C:
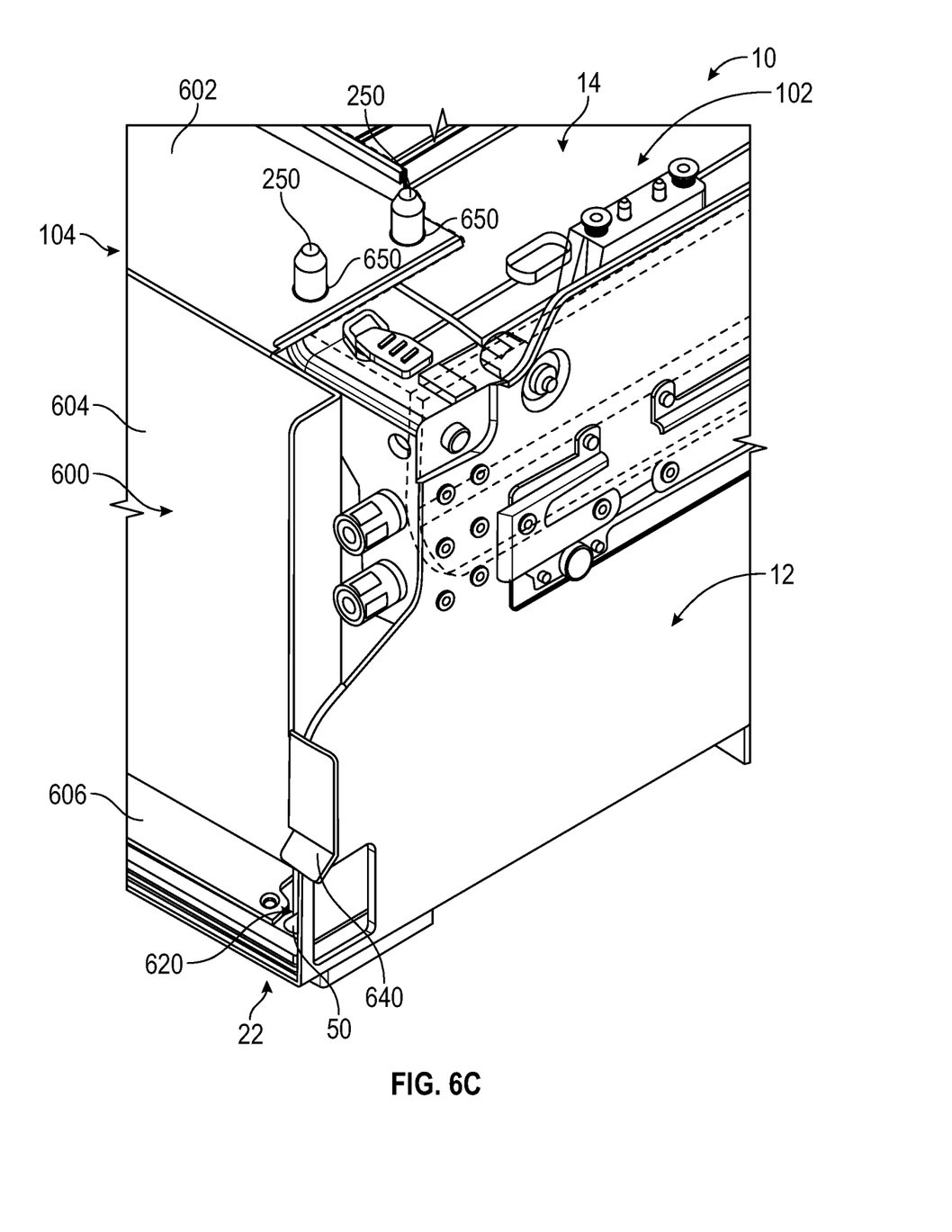
FIG. 6C illustrates a partial rear view of the jig aligned with the computing system.

FIGS. 6A, 6B, and 6C illustrate the rear component 104. As shown in FIG. 6A, the rear component 104 can be operable to be positioned adjacent the rear end 22 of the GPU board 14 and the GPU tray 12. The rear component 104 can then protect the GPU components 16, such as the heatsinks, leaving only access to the screws 50. The rear component 104 can include an upper panel 602 and a rear panel 604. The upper panel 602 can be positioned above the GPU system 10 and can be substantially aligned with and parallel with the front component 102. The rear panel 604 can extend substantially perpendicularly from the upper panel 602 and be operable to cover the rear end 22 of the GPU system 10 such as the heatsinks.

The rear component 104 can be operable to be coupled with the front component 102. In at least one example, as illustrated herein, the rear component 104 and the front component 102 can be separate pieces to avoid interferences. In some examples, the rear component 104 and the front component 102 can be integral as one piece. To align the rear component 104 with the front component 102 and couple the rear component 104 with the front component 102, the front component 102 can include one or more top alignment components 250 and the rear component 104 can include one or more corresponding rear alignment components 650. In at least one example, as illustrated in FIGS. 6A-6C, the top alignment components 250 can extend outward from the front component 102, such as posts. The corresponding rear alignment components 650 can include apertures formed by the rear component 104. In some examples, the rear alignment components 650 can be formed in the upper panel 602 of the rear component 104. Accordingly, in such example(s), the top alignment components 250 can be operable to be received by the rear alignment components 650. In some examples, the top alignment components 250 can include apertures while the rear alignment components 650 can extend from the upper panel 602 of the rear component 650 such as posts. In such example(s), the rear alignment components 650 can be received by the top alignment components 250. Any combination of configuration of the rear alignment components 650 and the top alignment components 250 can be utilized without deviating from the scope of the disclosure. The use of the top alignment components 250 and the rear alignment components 650 allows for easily removable coupling of the front component 102 with the rear component 104. Accordingly, the front component 102 and the rear component 104 of the jig 100 can be positioned on the GPU system 10 without interfering with the GPU board 14 and/or the GPU tray 12.

In some examples, as illustrated in FIGS. 6B and 6C, the rear component 104 can include one or more alignment portions 640 which are operable to align the rear component 104 with the GPU system 10. The alignment portions 640 can be configured to correspond with conventional features of the GPU system 10. For example, as shown in FIG. 6C, the GPU tray 12 can have a rear surface, and the alignment portions 640 can be angled such that the rear surface receives the alignment portions 640 of the rear component 104. The alignment portions 104 can provide alignment while avoiding interferences with features of the GPU system 10 (e.g., the GPU board 14 and/or the GPU tray 12). Accordingly, when the rear component 104 is properly aligned, the alignment portions 640 are received by the conventional features of the GPU system 10, and no additional modifications of the GPU system 10 are needed for the GPU system 10 to work with the jig 100.

In at least one example, as illustrated in FIGS. 6A and 6B, the rear component 104 can include one or more handles 608. With the handles 608, for example, a user can have a good hold on the rear component 104 for positioning and/or removal of the rear component 104.

In at least one example, the rear component 104 can be at least partially made of sheet metal and/or tooled plastic. The rear component 104 can be at least partially made of sheet metal and/or tooled plastic due to limitations of bending acrylic while also protecting exposed heatsinks of the GPU system 10. In some examples, referring to FIG. 6B, at least a portion of an inner surface 630 of the rear component 104 can include mylar to prevent any sheet metal contact with the GPU system 10. The inner surface 630 of the rear component 104 faces the GPU system 10 such that the inner surface 630 is proximate the GPU system 10 (e.g., the GPU components 16 of the GPU board 14).

In at least one example, as illustrated in FIGS. 6A-6C, the rear component 104 can include a plurality of screw openings 620 which are aligned with rear screws 50 of the plurality of screws 50 such that the screw openings 620 provide access to the rear screws 50. The screw openings 620 can be operable to receive the tool (e.g., screwdriver) so that the tool can access the rear screws 50 while restricting access to any other portions of the GPU system 10. The rear screws 50 can be positioned proximate the rear end 22 of the GPU system 10. With the screw openings 620, the rear component 104 only provides access to the screws 50 and restricts contact with any other portion of the GPU system 10. Accordingly, the user's restriction reduces or prevents damage to the GPU system 10 while fastening and/or unfastening the screws 50. In at least one example, as illustrated in FIGS. 6A-6C, the screw openings 620 can be formed on a rear lip 606 of the rear component 104. The rear lip 606 can extend from the rear panel 604. In some examples, the rear lip 606 can extend substantially perpendicularly from the rear panel 604. The rear lip 606 can extend from a bottom of the rear panel 604, the bottom of the rear panel 604 being opposite the upper panel 602 in relation to the rear panel 604. In some examples, the rear lip 606 can extend substantially parallel to the upper panel 602.

Figure 7A:
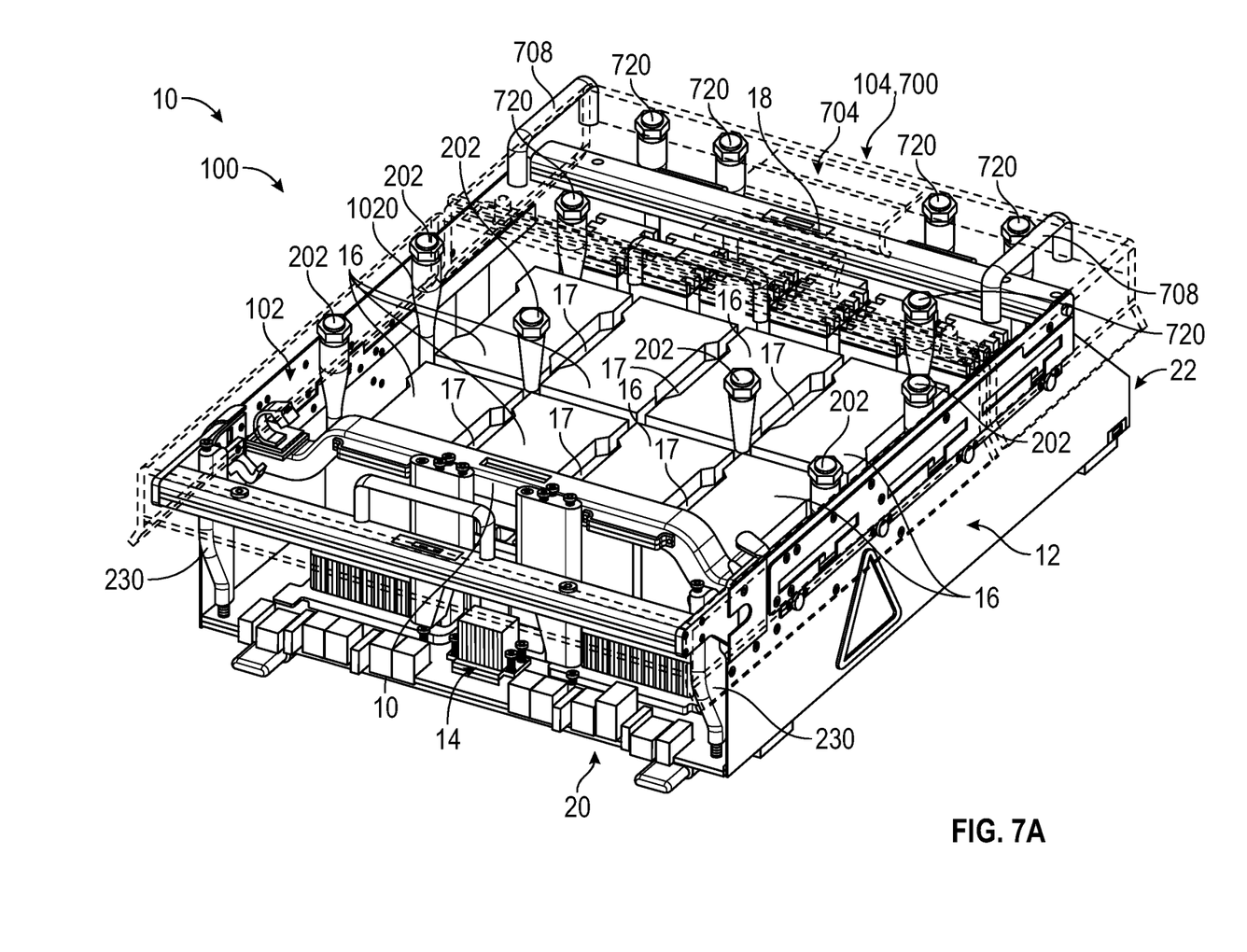
FIG. 7A illustrates the computing system with an example of the jig.
Figure 7B:
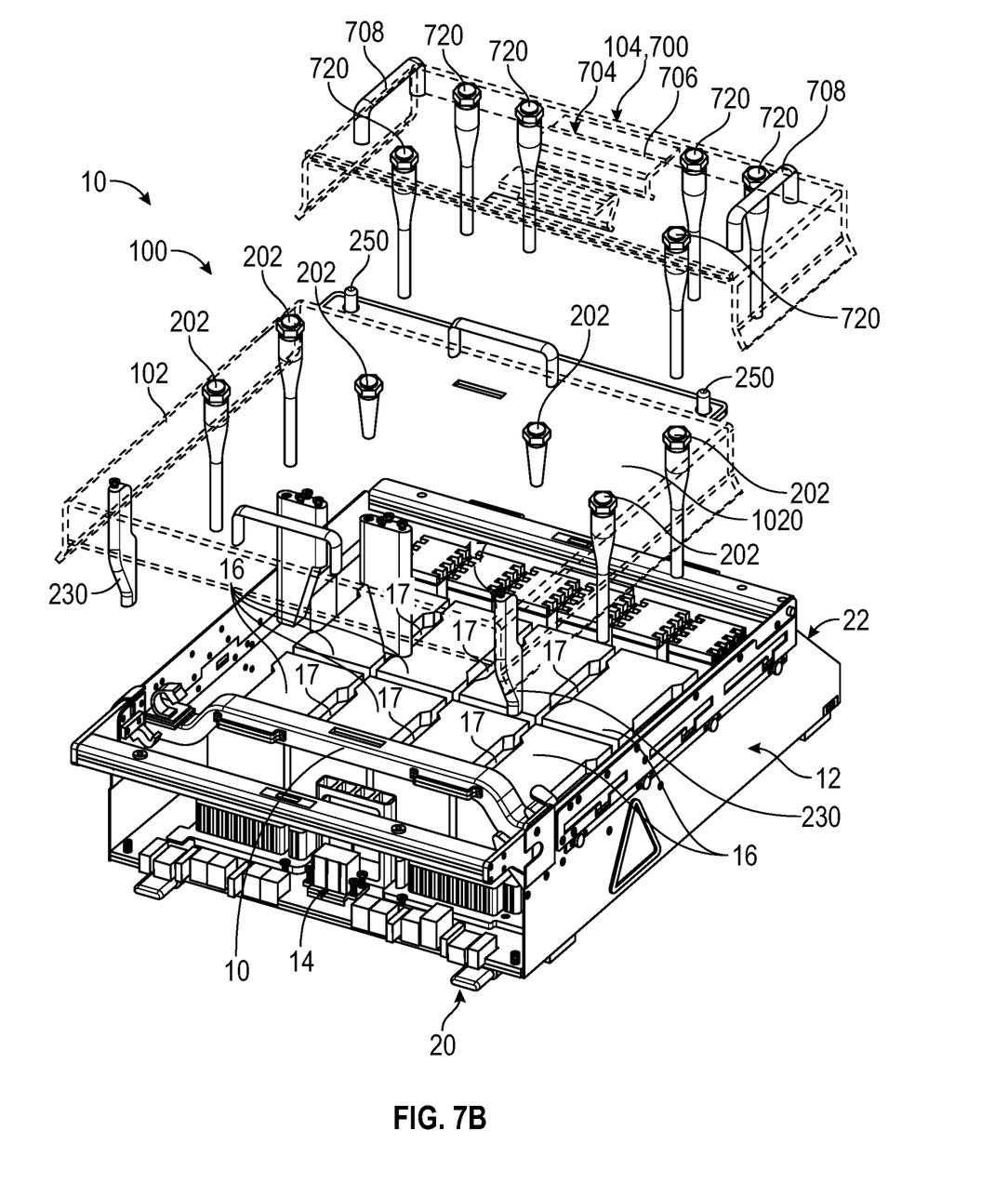
FIG. 7B illustrates an exploded view of the computing system of FIG. 7A.

FIGS. 7A and 7B illustrate another example of the jig 100, where the rear component 104, 700 has a different configuration to accommodate a different type of GPU system 10. In the jig 100 as illustrated in FIGS. 7A and 7B, the front component 102 can be substantially the same with a top panel 1020 with a plurality of guide tubes 202, and in some examples, guide blocks 230.

In the jig 100 as illustrated in FIGS. 7A and 7B, the rear component 700 extends along the rear end 22 of the GPU system 10. However, a majority of the rear component 700 is made of the upper panel 704 instead of a rear panel 604 as in FIGS. 6A-6C. Similar to the front component 102, the upper panel 704 of the rear component 700 can include a plurality of guide tubes 720 can extend from the upper panel 704. The guide tubes 720 can be operable to be aligned with the screws 50 to couple the GPU board 14 with the GPU tray 12. For example, as illustrated in FIGS. 7A and 7B, the upper panel 704 can include 6 guide tubes 720 that correspond with and are aligned with 6 screws 50 for coupling the GPU board 14 with the GPU tray 12. The guide tubes 720 can be coupled with the upper panel 704 such that the tool (e.g., screwdriver; not shown) can be inserted into the guide tubes 720 through the upper panel 704 and gain access to the screws 50 to fasten the screws 50 within the screw holes 52. Accordingly, the guide tubes 720 can be operable to receive and guide the tool to gain access to the plurality of screws 50. As the tool can only be inserted into the GPU system 10 via the guide tubes 720, the tool does not damage the GPU system 10 and is directed directly to the screws 50 for easy assembly/disassembly by the user.

In some examples, the guide tubes 720 can be operable to extend to the screws 50 such that the guide tubes 720 are a short distance (e.g., less than 5 millimeters, in some examples less than 2.5 millimeters) above the screws 50 so that the tool is easily guided to the screws 50. In at least one example, the guide tubes 720 are operable to extend between the GPU components 16 of the GPU board 14. For example, the guide tubes 720 are positioned such that when the upper panel 704 is coupled with the GPU system 10, the guide tubes 720 extend into the gaps 17 between the GPU components 16. In at least one example, the guide tubes 720 can be operable to extend from the upper panel 704 and have a length of between about 50 millimeters and about 145 millimeters. In some examples, at least one of the guide tubes 720 can be operable to abut to the GPU components 16. The guide tubes 720 can have customizable heights so that the guide tubes 720 correspond with the GPU system 10 and the placement of the screws 50.

In at least one example, the guide tubes 720 can be detachably coupled with the upper panel 704 such that the guide tubes 720 can each be replaceable. Accordingly, as the guide tubes 720 wear down due to use, the guide tubes 720 can be easily replaceable without needing to replace the entire jig 100 or upper panel 704.

In at least one example, as illustrated in FIGS. 7A and 7B, the upper panel 704 can be at least partially transparent. Accordingly, the rear component 700 provides visibility so the user can still visibly see how the jig 100 is aligned and whether the guide tubes 720 are in the desired positions. In some examples, the upper panel 720 can include an acrylic material.

In at least one example, the rear component 700 can include a flange 706 that is operable to receive the handle 18 of the GPU system 10 to couple the rear component 700 with the GPU system 10. The flange 706 can wrap around the handle 18 to eliminate undesired movement of the rear component 700. Accordingly, the rear component 700 can easily couple with the GPU system 10 utilizing the features of the GPU system 10 without needing additional modification. The rear component 700 can be operable to be retrofit to the GPU system 10.

In at least one example, as illustrated in FIGS. 7A and 7B, the rear component 700 can include one or more handles 708. With the handles 708, for example, a user can have a good hold on the rear component 700 for positioning and/or removal of the rear component 700.

The embodiments shown and described above are only examples. Even though numerous characteristics and advantages of the present technology have been set forth in the foregoing description, together with details of the structure and function of the present disclosure, the disclosure is illustrative only, and changes may be made in the detail, especially in matters of shape, size and arrangement of the parts within the principles of the present disclosure to the full extent indicated by the broad general meaning of the terms used in the attached claims. It will therefore be appreciated that the embodiments described above may be modified within the scope of the appended claims.

What is claimed is:

1. A jig for a graphics processing unit (GPU) system, the jig comprising:
   a front component operable to couple with the GPU system, the front component including:
      a top panel operable to enclose a GPU board of the GPU system; and
      a plurality of guide tubes extending from the top panel, the plurality of guide tubes operable to be aligned with a plurality of screws to couple the GPU board with a GPU tray, wherein the plurality of guide tubes are operable to receive and guide a tool to gain access to the plurality of screws.

2. The jig of claim 1, wherein the plurality of guide tubes extend from the top panel towards the plurality of screws.

3. The jig of claim 1, wherein the top panel is at least partially transparent.

4. The jig of claim 1, wherein the top panel includes an acrylic material.

5. The jig of claim 1, wherein the plurality of guide tubes are detachably coupled with the top panel such that the plurality of guide tubes are each replaceable.

6. The jig of claim 1, wherein the front component includes one or more guide blocks operable to align the front component with the GPU system.

7. The jig of claim 6, wherein the one or more guide blocks are operable to be received by conventional features of the GPU system.

8. The jig of claim 1, wherein the front component includes a flange operable to receive a handle of the GPU system to couple the front component with the GPU system.

9. The jig of claim 1, wherein the front component is operable to be retrofit to the GPU system.

10. The jig of claim 1, further comprising a rear component operable to be coupled with the front component, the rear component operable to be positioned adjacent a rear end of the GPU board and the GPU tray.

11. The jig of claim 10, wherein the front component includes one or more top alignment components and the rear component includes one or more corresponding rear alignment components, wherein the one or more top alignment components and the one or more rear alignment components align the rear component with the front component.

12. The jig of claim 11, wherein the one or more top alignment components are operable to be received by the one or more rear alignment component.

13. The jig of claim 10, wherein the rear component is at least partially made of sheet metal and/or tooled plastic.

14. The jig of claim 10, wherein at least a portion of an inner surface of the rear component includes mylar.

15. The jig of claim 10, wherein the rear component includes a plurality of screw openings aligned with rear screws of the plurality of screws such that the plurality of screw openings provide access to the rear screws.

16. The jig of claim 10, wherein the rear component is operable to enclose heatsinks of the GPU board.

17. A system comprising:
a GPU system including a GPU board and a GPU tray operable to receive the GPU board;
a plurality of screws operable to couple the GPU board with the GPU tray; and
a jig including a front component operable to couple with the GPU system, the front component including:
a top panel operable to enclose the GPU board; and
a plurality of guide tubes extending from the top panel, the plurality of guide tubes operable to be aligned with the plurality of screws, wherein the plurality of guide tubes are operable to receive and guide a tool to gain access to the plurality of screws.

18. The system of claim 17, wherein the jig further includes a rear component operable to be coupled with the front component, the rear component operable to be positioned adjacent a rear end of the GPU board and the GPU tray.

19. The system of claim 17, wherein the jig is removably coupled with the GPU system.

20. The system of claim 17, wherein the jig is operable to cover the GPU system such that the only access to the GPU system is through the plurality of guide tubes to access the plurality of screws.

* * * * *